United States Patent [19]
Bhandari et al.

[11] Patent Number: 5,392,038
[45] Date of Patent: Feb. 21, 1995

[54] SERIAL DATA DECODING FOR VARIABLE LENGTH CODE WORDS

[75] Inventors: Rajan Bhandari; Clive H. Gillard, both of Basingstoke, United Kingdom

[73] Assignee: Sony United Kingdom Ltd., Staines, United Kingdom

[21] Appl. No.: 70,877

[22] Filed: Jun. 3, 1993

[30] Foreign Application Priority Data

Jul. 13, 1992 [GB] United Kingdom ................ 9214825

[51] Int. Cl.6 ............................................ H03M 7/40
[52] U.S. Cl. .................................................... 341/67
[58] Field of Search ............... 382/56; 358/426, 261.2, 358/261.1, 261.4, 427, 430, 433; 341/65, 67, 51

[56] References Cited
U.S. PATENT DOCUMENTS 4,092,665 5/1978 Saran ................................. 358/261
4,420,771 12/1981 Pirsch ................................. 358/261
4,985,766 1/1991 Morrison et al. ................... 358/133

Primary Examiner—Brian K. Young
Attorney, Agent, or Firm—William S. Frommer; Alvin Sinderbrand

[57] ABSTRACT

A serial data decoder is described employing a bank of parallel primary Huffman decoders 70 each operating to decode a stream of variable length code words with embedded control code words into a stream of fixed length index values. The fixed length index values are fed to a secondary decoder which operates under control of the fixed length index values representing control code words to decode the fixed length index values representing the variable length code words into output data.

17 Claims, 11 Drawing Sheets

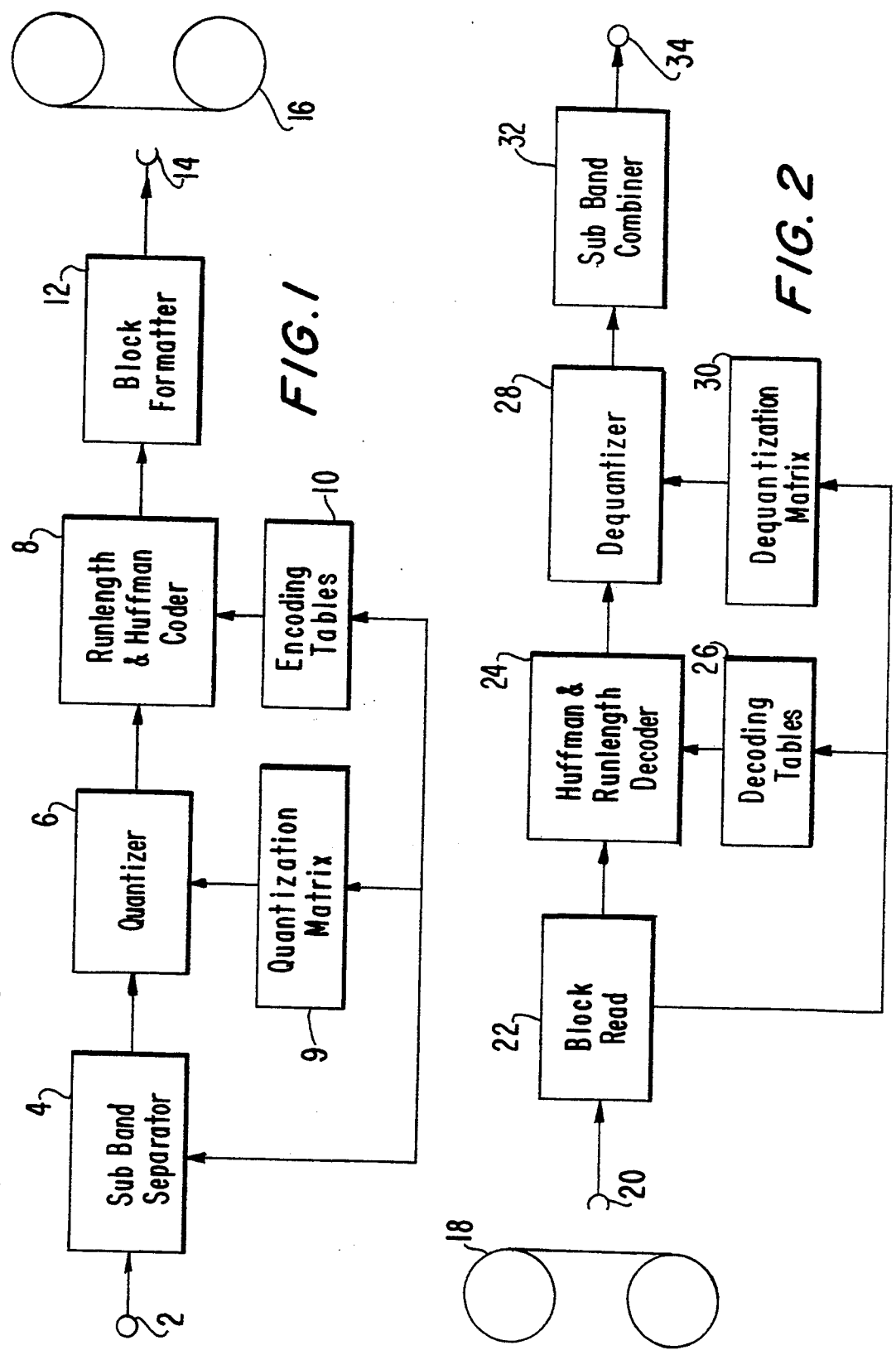

SERIAL DATA DECODING FOR VARIABLE LENGTH CODE WORDS

BACKGROUND OF THE INVENTION

1. Field of the Invention

This invention relates to serial data decoding. More particularly, this invention relates to serial data decoding of a stream of variable length code words within which are imbedded control code words.

2. Description of the Prior Art

It is known to provide systems using streams of variable length codes to represent image data in a compressed form. An example of such a system is that proposed by the Joint Photographic Experts Group (JPEG). The JPEG system is primarily intended for use in compressing still images within general purpose computer systems. In such general purpose computer systems the necessary encoding and decoding can be performed with appropriate software. Whilst such an approach can be flexible and inexpensive, it will not be able to process data at a high enough rate to meet the requirements of providing real-time encoding and decoding of moving image data.

In order to meet this requirement dedicated hardware may be provided. British Patent Applications 9121122.7 and 9121123.5 (Sony Broadcast & Communications Limited) disclose one possible hardware decoder for serial data decoder for containing variable length codes. Although such hardware decoders provide high speed operation, they can be disadvantageously complex. One situation which can lead to such disadvantageous complexity is when control code words are embedded within the variable length code words. These control code words may be used to control the parameters by which the variable length code words are to be decoded. A hardware decoder capable of modifying its own operation in dependence upon decoded control code words whilst maintaining a high speed of operation would pose significant practical difficulties to implement.

SUMMARY OF THE INVENTION

Viewed from one aspect this invention provides apparatus for decoding blocks of serial data each containing variable length code words and control code words, said apparatus comprising:

(i) a primary decoder for decoding said blocks of serial data into blocks of Fixed length index values representing said variable length code words and said control code words; and (ii) a secondary decoder operating under control of fixed length index values representing control code words of a block for decoding each of said fixed length index values representing a variable length code words of said block into a variable length sequence of output data values.

The provision of a two-stage system in which variable length code words and control code words, which may or may not be of variable length, are decoded into fixed length index values allows an advantageous reduction in the amount of hardware needed to implement the decoder. The action of the primary decoder in transforming from variable length codes to fixed length codes significantly eases the task of the secondary decoder in using embedded control code words to modify its own operation.

It will appreciated that the variable length code words could take many forms. However, in the context of the high speed processing of compressed image data Huffman coding is particularly deficient. Furthermore, in achieving a good degree of compression it is also advantageous that said variable length code words represent runlength codes.

The decoder of the invention may be used outside of the field of image data processing, such as audio data processing, but it is particularly suited to embodiments in which at least some of said control code words of a block identify a position within an array of data represented by said variable length code words of said block.

In preferred embodiments of the invention the block structure of the serial data can be utilized to reduce the effect an error in one block has upon other blocks by providing that at least some of said control code words of a block identify a position within an array of data represented by said variable length code words of said block.

It will be appreciated that in a variable length coding system a decoding error can be difficult to recover from since the phase of the variable length code words is unknown. Thus, a decoding error within one block may cause a loss of data for that entire block, but by providing control code words that identify a block position within an array of data the loss of phase information can be limited to only one block.

A desirable feature of many coding systems is the use of quantization to achieve improved data compression. In this circumstance the decoder requires a dequantizer. In more sophisticated systems the decoder includes a dequantizer for dequantizing said output data values according to a variable dequantization factor.

The use of a variable dequantization factor imposes the additional requirements that the decoder must be responsive to changes in the dequantization factor that occurred during encoding and to this end at least some said control code words of a block identify what dequantization factor is used for said block.

In a similar manner to the way in which compression can be improved by the use of a variable quantization factor, in preferred embodiments of the invention said primary decoder uses a selectable one of a plurality of primary decoding tables and at least some of said control code words of a block identify what; decoding table is used for said block.

Once again, the provision of a plurality of decoding tables introduces the requirement that the decoder should be able to dynamically switch to different decoding tables and accordingly should be able to support appropriate embedded control code words.

The decoding by the secondary decoder from the fixed length index values to the output data may follow various different schemes. However, in a preferred embodiment within a relatively high compression system said secondary decoder comprises an index decoder that maps fixed length index values representing variable length code words to runlength code including a start value, a length value of a run of said start values and an end value terminating said run of said start values.

In order to support this mapping by the index decoder whilst maintaining high speed operation, in preferred embodiments said secondary decoder comprises a runlength state machine responsive to said start value, said length value and said end value to control a multiplex to select for output said start value for a run equal in length to said length value and then select for output said end value.

In an analogous way to the use of a plurality of decoding tables by the primary decoder, this technique can also be used to an advantage within the secondary decoder. In order to preserve high speed operation whilst supporting such a feature said secondary decoder comprises a marker detector responsive to a fixed length index value representing a control code word that is a marker code to trigger said index decoder to use a different selectable one of a plurality of secondary decoding tables.

The variable dequantization factor discussed earlier can be tied to a particular secondary decoding table and in such a circumstance it is convenient that said marker detector triggers said dequantizer to use a different dequantization factor.

The need to allow the embedded control code words to dynamically modify the operation of the secondary decoder is assisted in preferred embodiments in which said index decoder and said marker detector are configured as parallel pipeline delays for holding fixed length index values from said primary decoder and said marker detector operates to inhibit operation of said runlength state machine during decoding of a marker code.

The two-stage structure of the decoder and its operation upon blocks of serial data are such that if block headers of control code words are used in the serial data then the block of fixed length index values will also include a index value header. In this way, the convenience of concentrating control code words within a header is preserved in both stages.

The primary decoder can assist in conveniently preserving this header structure by outputting a header flag with each fixed length index value indicating whether that fixed length index value is part of said index value header.

In a similar way the interfacing of the primary decoder and the secondary coder is assisted in embodiments in which said primary decoder outputs a validity flag indicating that a fixed length index value at its output is valid data. The way in which the secondary decoder handles the various flags passed to it in a manner which can control the other elements of the secondary decoder can be conveniently achieved in embodiments in which said secondary decoder comprises an flag store configured as a parallel pipeline with said index decoder and said marker detector.

The provision of this flag store is such that control may be achieved by providing that said runlength state machine is inhibited by said header flag indicating said index value header or said validity flag indicating invalid data.

Synchronisation between the various elements of the secondary decoder can be achieved and maintained by providing that pipelined data within said index decoder, said marker detector and said flag store are advanced with a common gated clock.

The decoding of variable length codes is generally a slower process than the decoding of fixed length codes since with fixed length codes, each fixed length code can be processed as a unit whereas with variable length codes the individual bits of the serial data have each to be considered. In order to allow for this mismatch in speeds, preferred embodiments of the invention comprise a plurality of parallel connected primary decoders operating in a timed sequence to decoder different portions of a stream of input data formed of said blocks of serial data, fixed length index values from each primary decoder being fed in sequence to said secondary decoder.

A related problem is that each primary decoder may have to wait for a period of time before the fixed length index values it has decoded are used by the secondary decoder. To accommodate this, preferred embodiments comprise a swing buffer between each of said primary decoders and said secondary decoder.

Viewed from another aspect this invention provides a method of decoding blocks of serial data each containing variable length code words and control code words, said apparatus comprising the steps of:
(i) decoding said blocks of serial data into blocks of fixed length index values representing said variable length code words and said control code words; and
(ii) decoding, under control of fixed length index values representing control code words of a block, each of said fixed length index values representing a variable length code words of said block into a variable length sequence of output data values.

The above, and other objects, features and advantages of this invention will be apparent from the following detailed description of illustrative embodiments, which is to be read in connection with the accompanying drawings.

BRIEF DESCRIPTION OF THE DRAWING

FIG. 1 illustrates an apparatus for compressing and recording image data;

FIG. 2 illustrates an apparatus for reproducing and decompressing image data;

DESCRIPTION OF THE PREFERRED EMBODIMENTS

Figure 3:
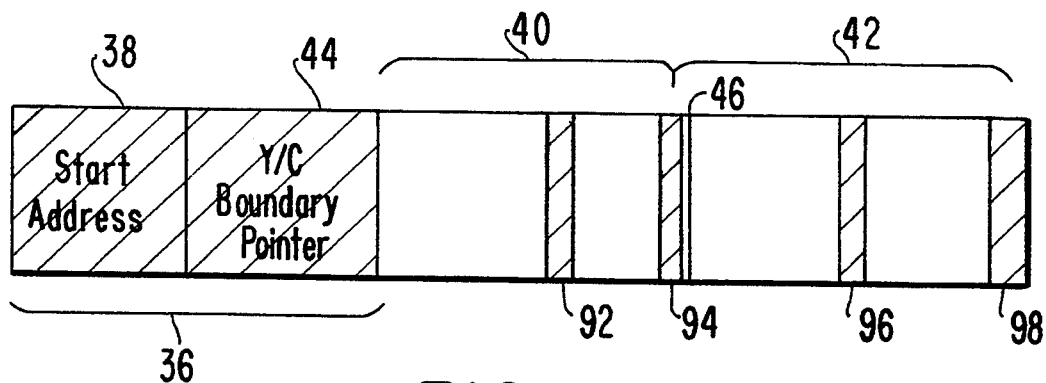
FIG. 3 illustrates a data block containing variable length code words and control code words.

FIG. 1 shows an image data compressing and recording apparatus. Image data is input at input node 2 and passed to a sub band separator 4. The sub band separator 4 includes banks of horizontal and vertical finite impulse response filters that serve to split and decimate the data into sub band components in the two dimensional spatial frequency domain (i.e. sub band transformation). Transformed data is then passed to a quantizer 6 where it is subject to a lossy quantization operation under control of data stored within a quantization matrix 9. The data output from thee quantizer 6 is passed to a runlength and Huffman coder 8. The runlength and Huffman coder 8 applies one of a plurality coding tables 10 to the data depending upon which sub band component the data originates from. The runlength and Huffman coder 8 exploits correlation within the data to effect compression. The output from the runlength and Huffman coder 8 is passed to a block formatter 12 which splits the data into a sequence of blocks of data in a serial data stream. This serial data stream is recorded via recording head 14 onto magnetic tape 16. Each block of data includes a header indicating the nature of the data contained in that block.

The sub band separator 4 outputs a signal indicative of which sub band component is currently being passed to the quantizer 6 and the runlength and Huffman coder 8. This signal is supplied to the quantization matrix 9 and the encoding tables 10 to select the degree of quantization and which encoding table ape to be applied to that sub band component.

FIG. 2 illustrates a reproducing and decompressing apparatus. A stream of serial data is read from a magnetic tape 18 by a read head 20 into a block read unit 22. The serial data is in the format of the sequence of blocks each including a heavier as described above. The block read unit 22 reads the header information and passes the serial data onto a runlength and Huffman decoder 24. The runlength and Huffman decoder 24 applies a selected decoding table 26 to the data and passes its output to a dequantizer 28. The dequantizer 28 applies a selected dequantization value from a dequantization matrix 30 to the data. The dequantized data is passed to a sub band combiner 32 where a bank of horizontal and vertical interpolating finite impulse response filters transform the data from the sub band domain to the spatial domain. The decoded, de-quantized and transformed data is then fed to output node 34.

The block read unit 22 extracts from the header of each block data indicating which sub band component the data within the block represents and uses this to select which of the decoding tables 26 is applied and what dequantization value is selected from the dequantization matrix at 30.

FIG. 3 illustrates a data block of the format used in the serial data stream recorded on the magnetic tape 16, 18. A header 36 contains control code words (CCW) including a start address 38 indicating the start position of the luminance data section 40 and the chrominance data section 42 within the transformed image. A control code word Y/C boundary pointer 44 within the header 36 gives the position 46 within the block at which the luminance data section 40 changes to the chrominance data section 42. The position 46 varies in dependence upon the relative degree of compression achieved for the luminance data and the chrominance data for a given section of the transformed image. Each block contains variable length code words (VLCW) encoding luminance data and chrominance data from the same section of the transformed image so as to facilitate the production of at least some form of image during shuttle replay in which only a fraction of the blocks of data are correctly read.

Figure 4:
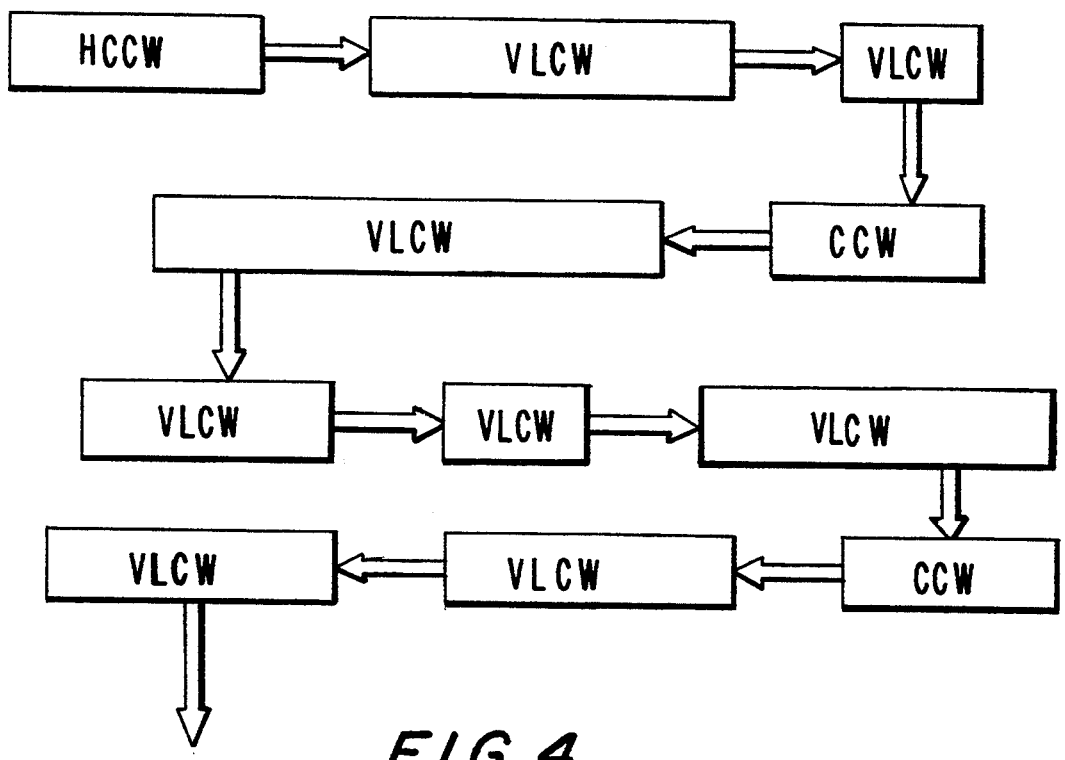
FIG. 4 illustrates a stream of serial data with control code words embedded within variable length code words.

FIG. 4 illustrates a part of the serial data stream of VLCWs and CCWs. The VLCWs are Huffman codes and it will be seen that individual ones of the VLCWs vary significantly in length. Embedded within the VLCWs are CCWs that control functions such as dynamically selecting differing Huffman decoding tables and the like.

Figure 5:
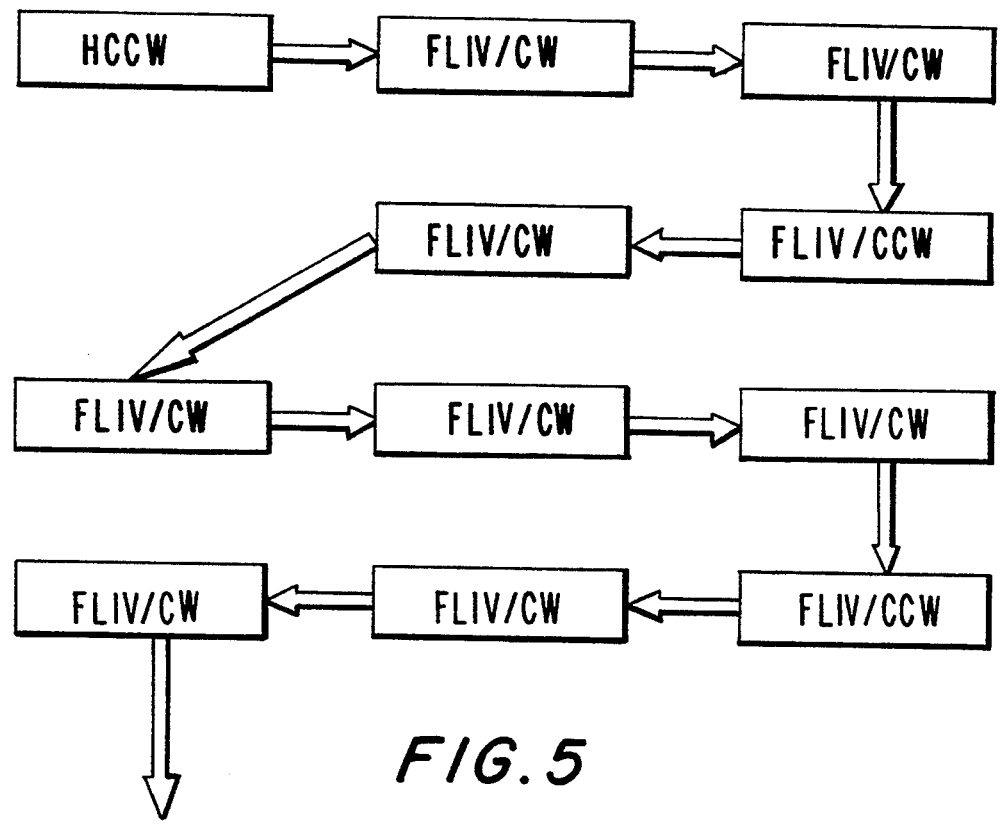
FIG. 5 illustrates the data of FIG. 4 after being mapped into fixed length index values.

FIG. 5 illustrates tile data of FIG. 4 after it has been subject to the first stage of decoding by a primary decoder. The function of the primary decoder is to map the VLCWs and CCWs into respective fixed length index values representing variable length code words (FLIV/CW) and fixed length index values representing control code words (FLIV/CCW). It will be seen that the FLIV/CCWs are embedded within the data stream at the same positions as the CCWs in FIG. 5. All of the fixed length index values have a uniform length making their processing by a secondary decoder more straightforward.

Figure 6:
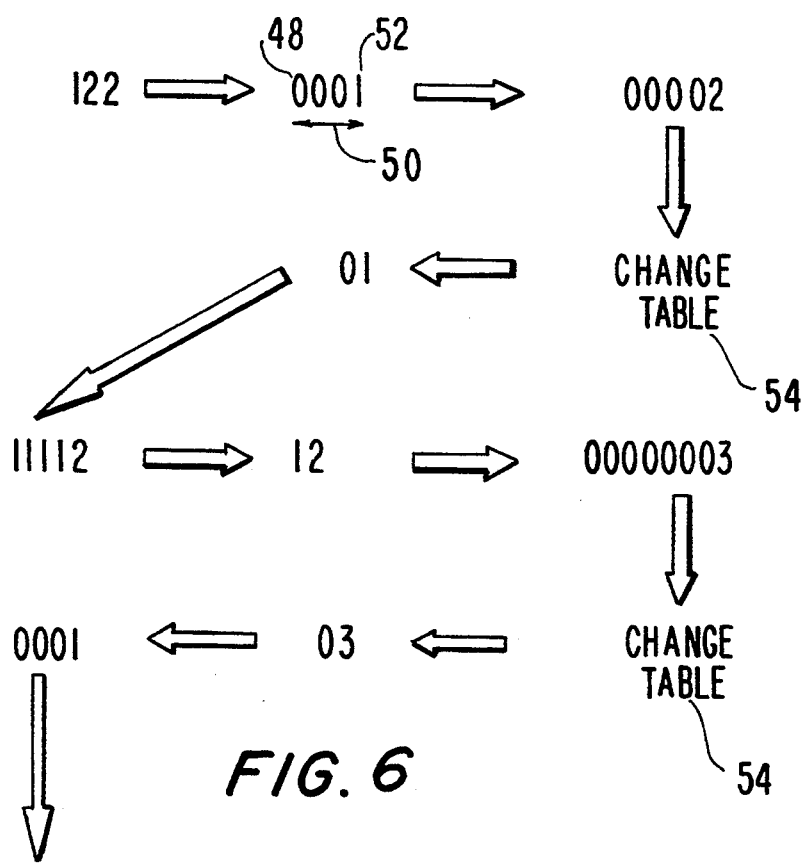
FIG. 6 illustrates the data of FIGS. 4 and 5 decoded into output data.

FIG. 6 illustrates the output data that is generated from the data stream of FIGS. 4 and 5. Each of tile VLCWs and FLIV/CWs defines a start value 48, a runlength for that start value 50 and an end value 52. This is a form of run length coding. The CCWs and FLIV/CCWs do not appear in the output data stream per se. Their function has been to modify the decoding parameters used during the decoding of the VLCWs and FLIV/CWs. For example, during the second decoding stage performed by the secondary decoder, a table mapping FLIV/CWs to corresponding start 48 run 50 and end 52 values is switched. These points 54 are schematically shown within the output data.

FIG. 4 illustrates an 8*8 array of two dimensional sub band spatial frequency components. Each sub band component 56 contains an array of sub band component data values. In a typical image, the information content is mainly in the lower spatial frequencies. The lowest spatial frequency sub band component 58 (the "DC" sub band) will have different characteristics to the highest frequency sub band component 60. Each of the sub band components 56 is subject to quantization with a matched quantization value selected from a quantization matrix and encoded with a matched coding table. The data within each sub band component 56 is raster scanned to form a serial data stream that is then subject to quantization and encoding. When the end of one sub band has been reached, the next sub band is raster scanned.

The finite size of the blocks of data illustrated in FIG. 3 has the effect that each particular block corresponds to particular section of the transformed image such as section 62. The start address 38 specifies the start position 64 of the section 62 within the transformed image.

Some data blocks will correspond to a section of the transformed image with a part 66 in one sub band and a part 68 in another sub band. In the case that these two sub bands require different coding tables, a switch of coding table is required part way through the encoding of the block in question and part way through the decoding of the block in question.

FIG. 4 illustrates the data comprising one of the luminance and chrominance data for an image. It will be understood that an analogous arrangement of sub band components, scanning patterns and relationships of data blocks to positions within sub bands will exist for the data representing the other of the luminance and chrominance components.

Figure 8:
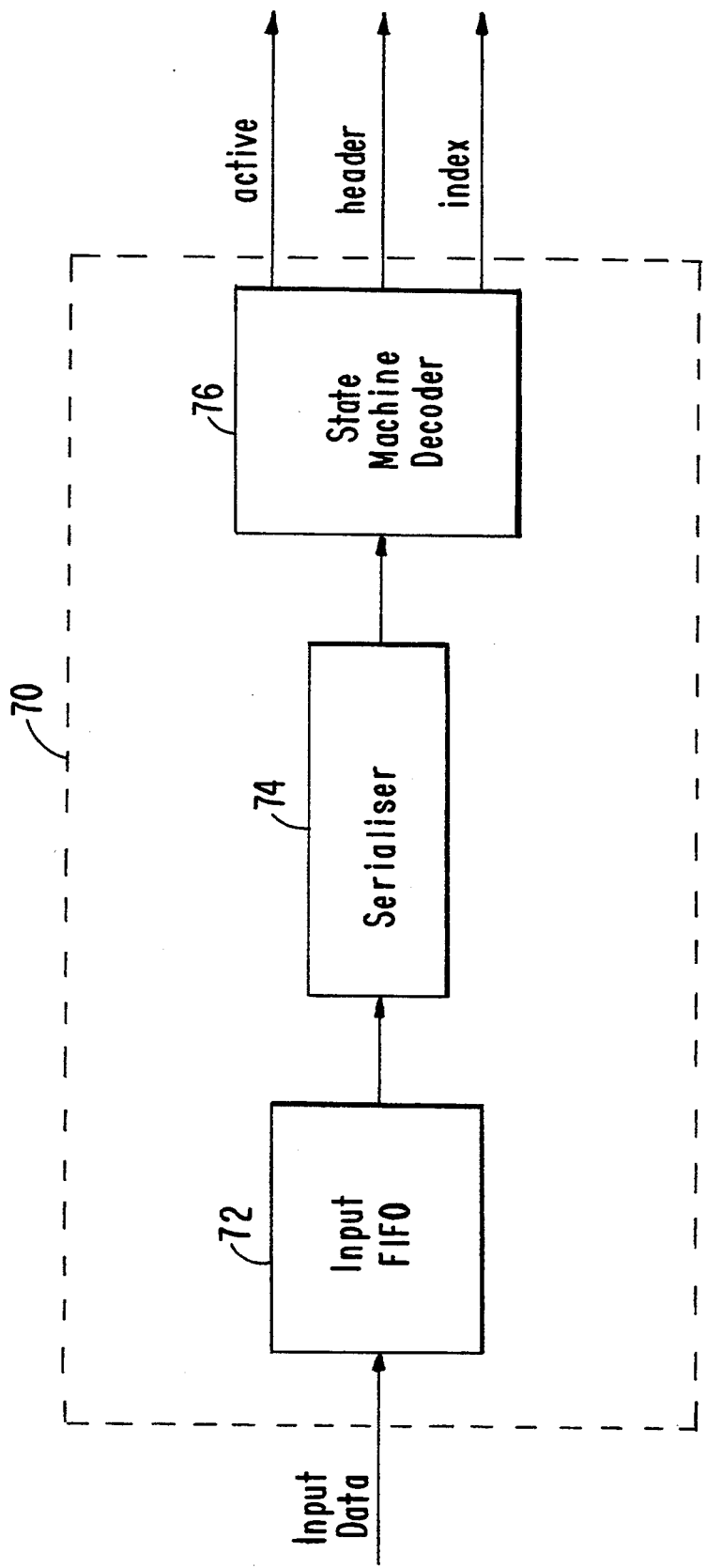
FIG. 8 illustrates a Huffman decoder (primary decoder)

FIG. 8 shows a primary decoder 70. Bytes of input data are fed to an input first in first out memory (FIFO) 72. The bytes of input data in the input FIFO 72 are converted into a stream of serial data by a serialiser 74. This stream of serial data is fed to a state machine decoder 76 that performs Huffman decoding upon the data. The output from the state machine 76 comprises a fixed length index value, a signal indicative of whether header data is being decoded and a signal indicative of whether the other outputs of the state machine decoder 76 are active width correctly decoded data at that time or are in the middle of decoding a serial word.

Figure 9:
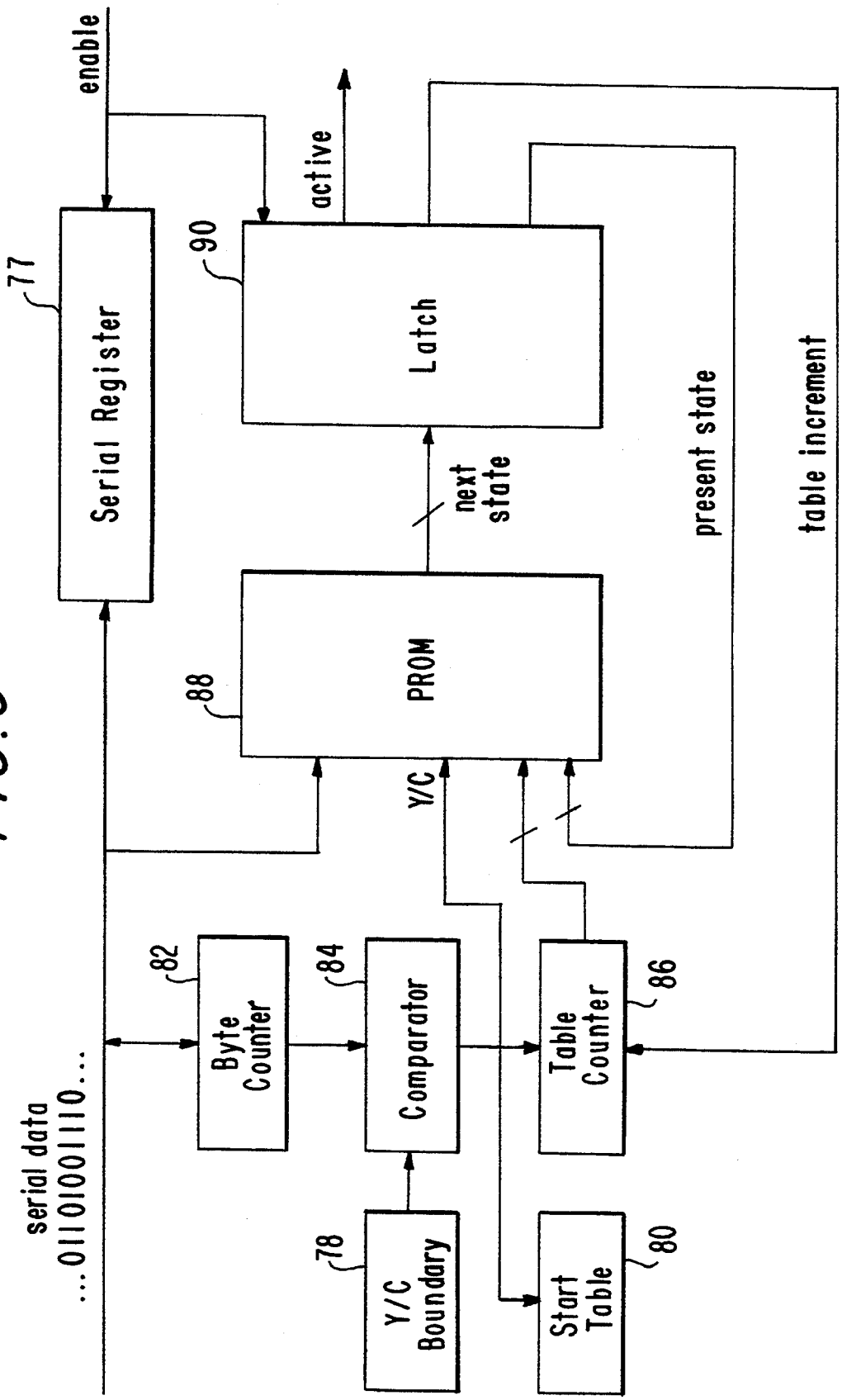
FIG. 9 illustrates in more detail the state machine decoder of FIG. 8.

FIG. 9 illustrates the state machine decoder 70 of FIG. 8 in more detail. The Y/C boundary pointer 44 from the header 36 of each block is loaded into a Y/C boundary memory 78 by the block read unit 22 at the start of each data block. The start address 38 from the header 36 is decoded to give an indication of which coding table should be used at the start of the luminance data section 40 and chrominance data section 42 of the data block in question. This starting table is stored within a start table memory 80. As the serial data from the data block in question is received, a byte counter 82 counts the number of bytes received. A comparator 84 compares the number of bytes received with the Y/C boundary pointer to determine if the point 46 has been reached. When the point 46 is reached, a switching signal Y/C is generated.

At the start of each data block, the starting table value stored in the start table memory 80 is loaded into a table counter 86 and in addition, when the comparator 84 generates a switching signal Y/C, this is fed to the table counter 86 and the start table memory 80 to reload the table counter 86 with the initial starting table value.

A programmable read only memory (PROM) 88 is addressed with a address value formed from a concatenation of a fed back present state value, a table count value from table counter 86, the switching signal Y/C and the next received bit of the serial data to be decoded. This concatenated address value acts to access a specific memory location within the PROM 88 and feed the contents of this memory location to a latch 90 where it is stored.

One bit of the latched value indicates whether or not a state corresponding to a valid code has been reached. Another bit of the latched value indicates whether an internal table selecting word has been received and if so feeds this back to the table counter 86 so as to increment the table count value stored therein. The remainder of the latched bits are fed back to the PROM 88 as present state values controlling the next memory location to be read and corresponding state to be entered. When a valid code is indicated, the present state value is read out as an index value to be mapped elsewhere to the actual value of the valid code.

Returning to FIG. B the data block includes further control code words 92, 94, 96 and 98. The control code words 92 and 96 are internal table selecting words. When the state machine of FIG. 9 enters a state indicating the completed reception of such an internal table selecting word, then the table increment flag is raised serving to increment the table count value stored in the table counter 86. The internal table selecting word is chosen to be a run of 1s of a predetermined length. This has the advantage that this code will be the lowest probability Huffman code and so should not severely impact the Huffman coding efficiency. Furthermore, since this word has no phase content, the full or partial insertion of the word into the serial data stream is made easier.

At the end of the luminance data section 40, and immediately prior to the point 46, a further special code 94 is inserted to place the state machine into transfer states that are distinct from all possible states that the state machine may adopt during decoding using any other decoding table and to bring the luminance data section 40 up to a byte boundary. Even if the luminance data section 40 without the control code 94 would finish on a byte boundary, a control code 94 is nevertheless inserted so as to make possible an unambiguous inter-component transfer. The asserting of the switching signal Y/C at point 46 after the state machine has adopted the transfer states serves to reset the state machine to the too of the branching hierarchy corresponding to the chrominance decoding table indicated by the contents of the start table memory 80. Since the system is reset after receipt of the control code 94 before any further data is decoded, in practice the same control code of a sequence of is can be used here as for the internal table selecting word.

The "present state" values for each of the partially decoded and fully decoded states of the internal table selecting words within each of the branching hierarchies are unique. In this way, these states can serve as the transfer states from which table switches can be made without the risk of any ambiguity as to which state the state machine is in.

At the end of the chrominance data section 42 is a filler control word 98 that serves to bring the data block up to its predetermined size. Again, since the state machine will be reset before decoding any further data, the filler control word 98 can be a sequence of all 1s. It will be appreciated that the control code words 94 and 98 will not be of fixed length and will respectively, have the length necessary to bring the luminance data section up to a byte boundary and that necessary to completely fill the chrominance data section. In the case of the filler control word 98, the filler may correspond to several complete internal table selecting words and accordingly will cycle the table count value through several increments. This does not matter since the system will be reset before any further decoding takes place.

Figure 10:
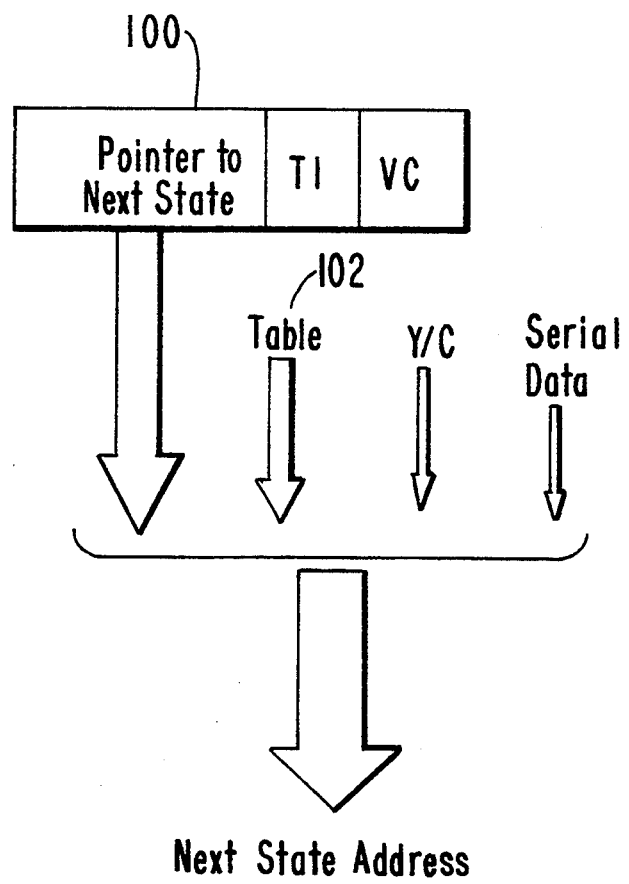
FIG. 10 illustrates the data used to control the movement between states of the state machine illustrated in FIG. 9.

FIG. 10 illustrates the control data stored within the memory locations of the PROM 88. Each memory location stores a pointer to the next state 100 and bits indicating whether the table count value should be incremented TI and that a state corresponding to a valid code has been reached VC. The pointer to the next state 100 is concatenated with the table count value 102, the switching signal Y/C and the serial data to produce the next state address supplied on what can be considered as a composite read address bus to the PROM 88.

Figure 11:
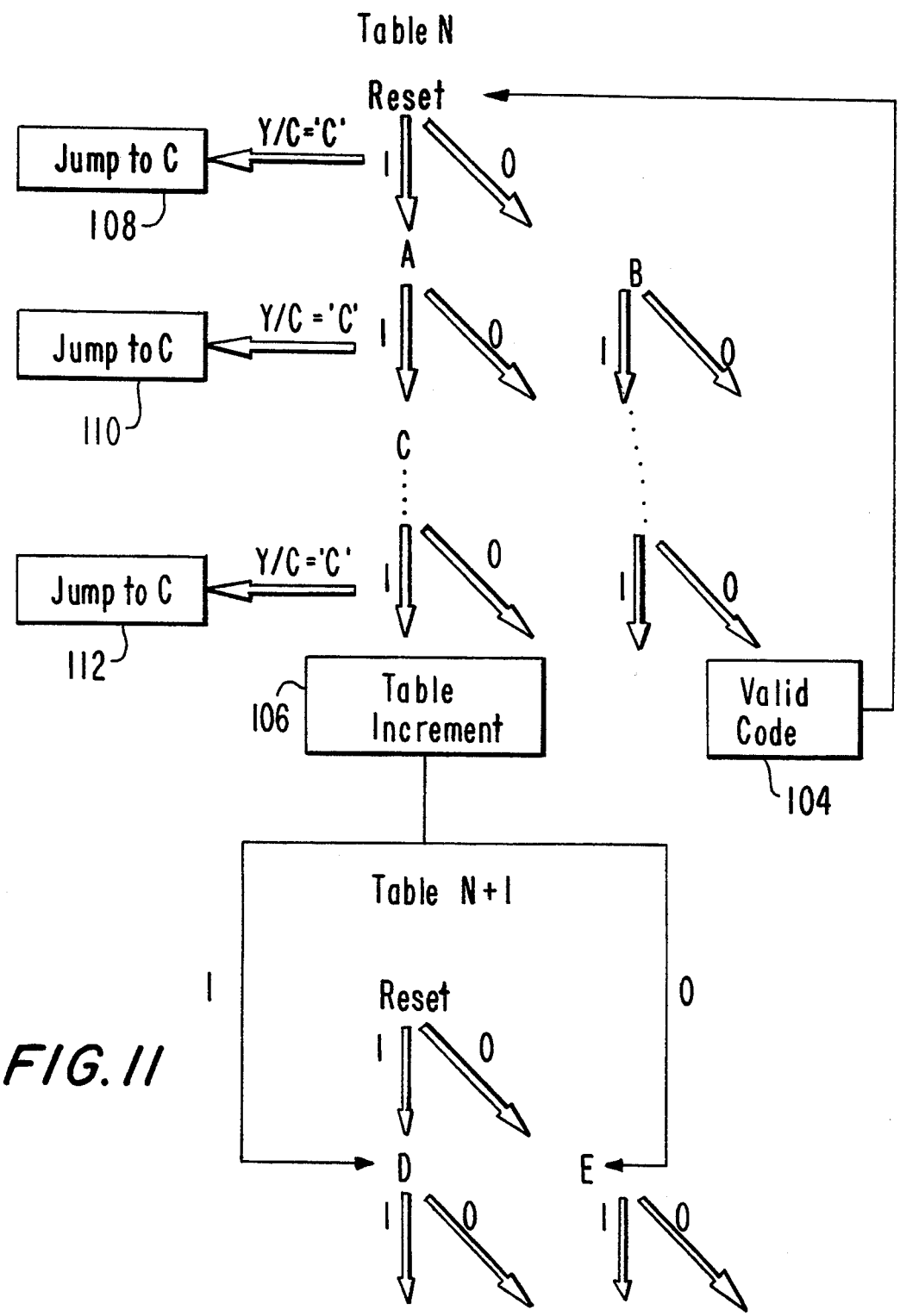
FIG. 11 schematically illustrates two branching hierarchies of states and possible movements from these hierarchies for the state machine of FIG. 9.

FIG. 11 schematically illustrates two branching hierarchies corresponding respectively to coding tables N and N+1. From the reset state at the start of each of the tables, the state machine branches to one of either of two states A or B depending upon whether a serial data bit of 1 or 0 is received. Decoding proceeds down the branching hierarchy until a state such as state 104 is reached corresponding to a valid code. At this point, the present state value is read as an index to the code value and the state machine returns to the reset state.

In the case of the receipt of a succession of 1s the state machine proceeds through a sequence of transfer states A, C etc. to a state 106 corresponding to receipt of the internal table selecting word whereupon the table count value is incremented. Each of these states A, C, etc. is distinct from any other state of the state machine such that if the externally applied switching signal Y/C is activated then an unambiguous jump to the first of the chrominance decoding tables may be made as illustrated by states 108, 110 and 112.

When the state 106 is reached corresponding to receipt of the complete special code word then the state machine progresses to either state D or state E upon the next cycle depending upon whether a 1 of 0 is received. If the serial data stream is at the end of the chrominance data section 42 and the bits of data being received are a filler word, then several tables may in fact be moved through prior to reaching the end of the data block.

Figure 12:
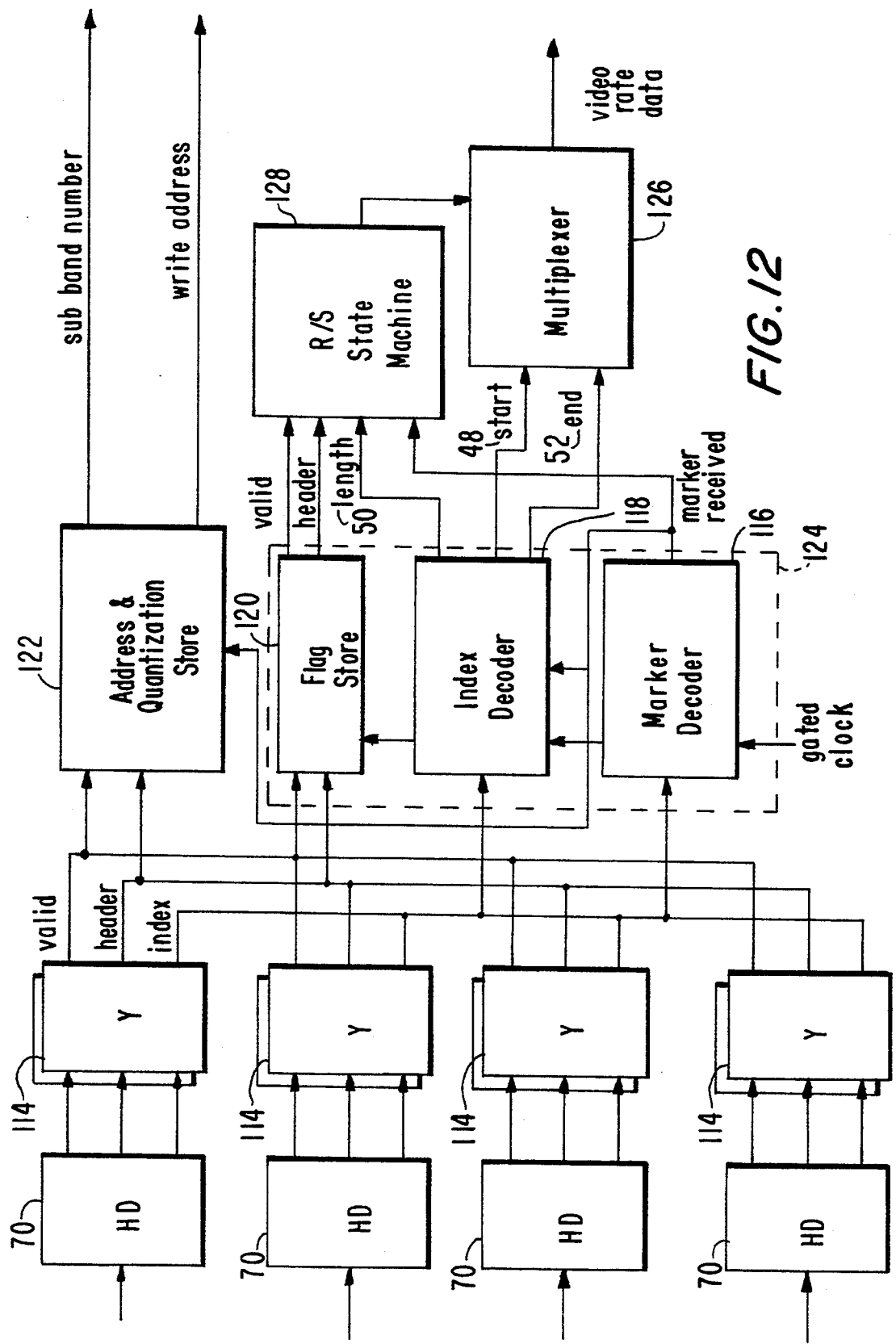
FIGS. 12 and 13 illustrate the primary and secondary decoders.
Figure 13:
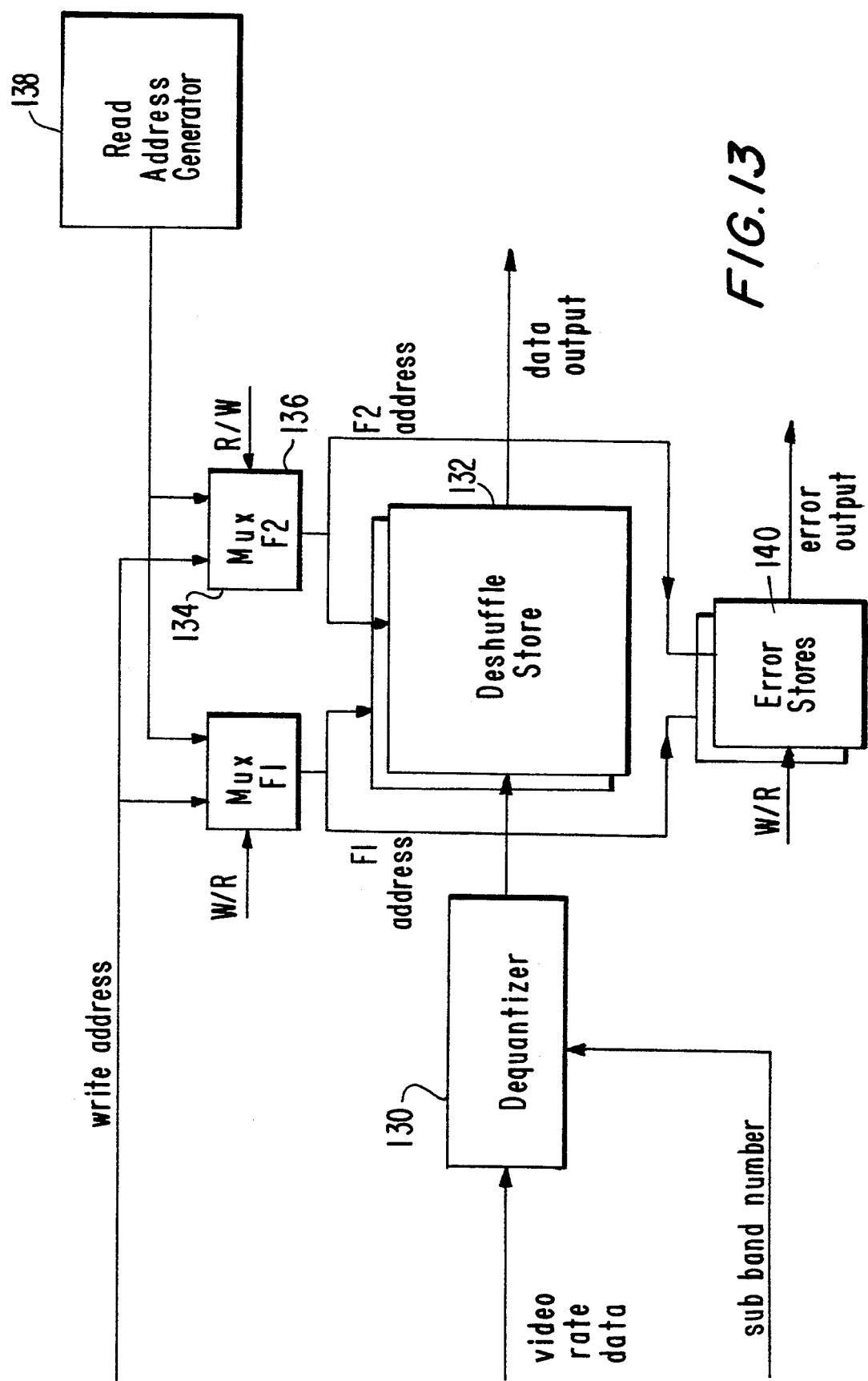

FIGS. 12 and 13 illustrate the secondary decoder in more detail and show its relationship to the primary decoders. Four parallel primary Huffman decoders 70 are each arranged to receive in sequence a quarter of the luminance data from each data block and store it in one side of a luminance swing buffer 114. Whilst one side of the swing buffer 114 is being written to by its primary Huffman decoder 70 the other side of the swing buffer 114 is being read by the secondary decoder. The serialization of the data illustrated in FIG. 8 that is performed by the primary Huffman decoder 70 means that the bytes of data input to the primary Huffman decoders 70 cannot be decoded at their full data rate. The parallel arrangement of primary Huffman decoders 70 alleviates this problem by allowing each to decode one quarter of the luminance data from a field over a full field period. The swing buffers 114 ensure that the data decoded by the primary Huffman decoder 70 is available for decoding by the secondary decoder at its full data rate.

The outputs from the swing buffers 114 are the index and header values output by the primary Huffman decoders 70 together with a validity flag that indicates when valid data is being output from the swing buffer 114. In contrast, the active signal output by the primary Huffman decoder 70 indicate whether the signals upon the output bus of the primary Huffman decoder 70 at any particular point in time are a valid code that should be latched and stored by the swing buffer 114.

As will be seen from FIG. 10 the index values have a fixed length limited by the bus width of the circuit and so correspond to the FLIV/CWs and FLIV/CWs illustrated in FIG. 5. The index signal is fed in parallel to a marker decoder 116 and an index decoder 118. The validity flag and the header flag are fed in parallel to a flag store 122 onto zero and an address and quantization store 122. During respective quarters of a field period the contents of each of the swing buffers 114 is fed to the secondary decoder under control of read signals (not illustrated).

The marker decoder 116, the index decoder 118 and the flag store 120 together comprise a pipeline delay unit 124 that is advanced under control of a common gated clock. The gated clock advances the pipeline delay unit 124 whenever a marker code is detected or a fixed length index value representing a variable length code has been completely decoded.

The index decoder 118 maps the received fixed length index value of the index signal into three signals representing respectively a start value a length of runs of that start value and an end value terminating the run. The start and end values are supplied to a multiplexer 126 and the length value is supplied to a run size state machine 128. The marker decoder 116 receives the index signal and raises a marker received flag whenever the index signal corresponds to a marker representing a control code word. The marker received signal is supplied in parallel to the run size state machine 128. The index decoder 118 and the address and quantization store 122. The index decoder 118 responds to a marker received signal by incrementing to the next decoding table. The address and quantization store 122 responds to the marker received signal by incrementing to the next quantization factor value. The run size state machine 128 responds to the marker received signal by resetting itself ready to receive the next fixed length index value representing a variable length code word from the input data.

The flag store 120 receives the validity flag and the header flag from the swing buffer 114 and passes these to the run size state machine 128 to inhibit operation of the run size state machine 128 when either a header is being output or the data is no longer valid.

The run size state machine 128 controls a multiplexer 126 to select for output as video rate data the start value for a run length specified by the length signal and then select for output a single value specified by the end signal.

Figure 7:
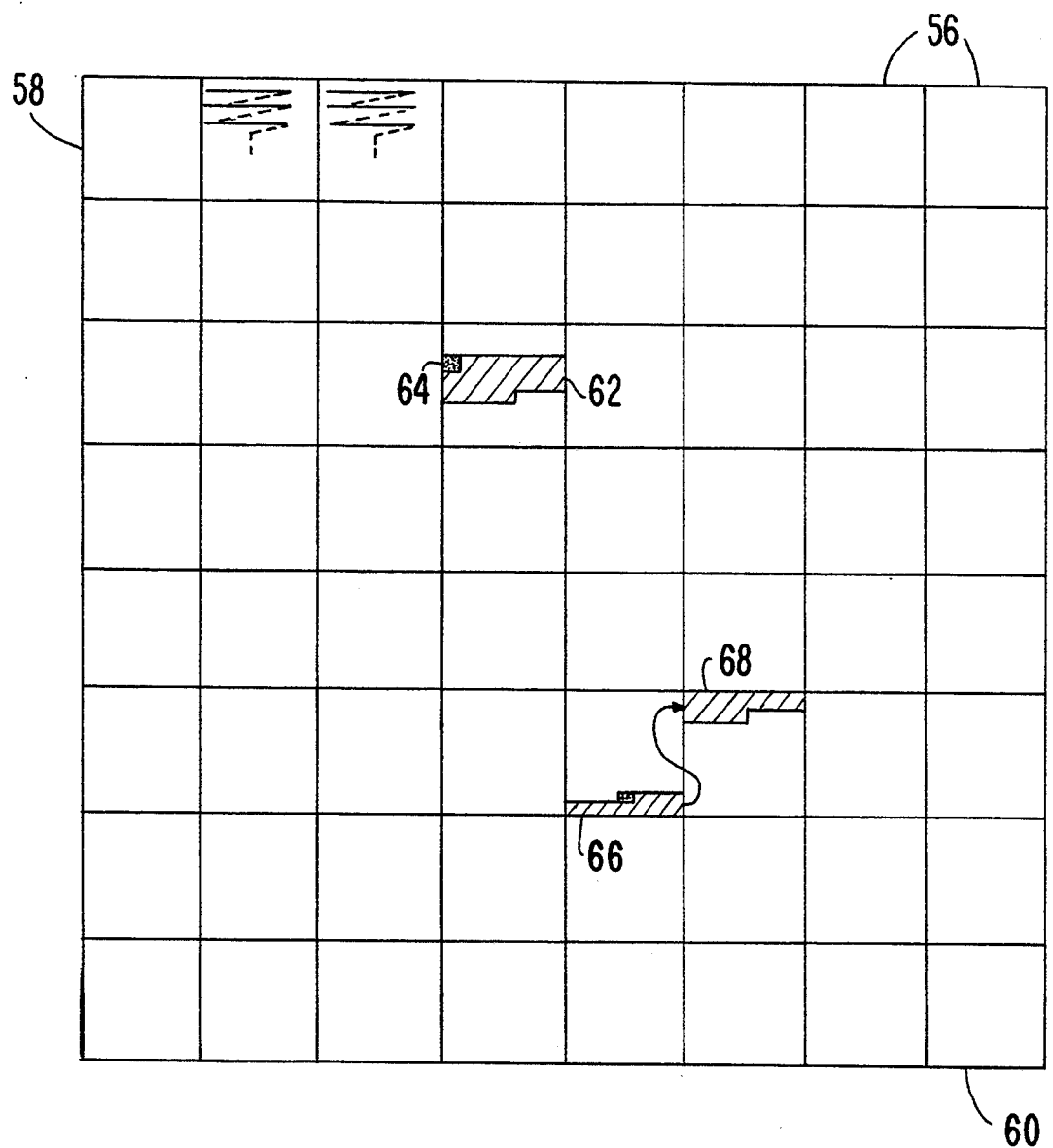
FIG. 7 illustrates the relationship between a data block of the type illustrated in FIG. 3 and positioned within an array of sub band components.

The address and quantization store 122 is responsive to the header data from each block to read the start position 64 within the sub band array of FIG. 7 and to generate an appropriate sequence of write addresses specifying the positions where the video rate data should be written.

FIG. 13 shows the final part of the secondary decoder. A dequantizer 130 receives the video rate data and the quantization factor and serves to dequantize the video rate data by an amount specified by the quantization factor. The output of the dequantizer 130 is fed to swing buffered deshuffle stores 132. One side of the swing buffer deshuffle stores 132 is being written to with the quantized data whilst the other side is being read from.

A field 1 address multiplexer 134 and a field 2 multiplexer 136 each received the write address from the address and quantization store 122 and a read address from a read address generator 138. When a particular side of the swing buffer deshuffle store 132 is being written to its associated multiplexer selects the write address whereas when it is being read from its associated multiplexer selects a read address. The differing orders of write addresses and read addresses that this makes possible allows the deshuffle store to compensate for any spatial subsampling and multiplexing that may previously have been imposed upon the data and returned the data into a form most suitable for subsequent processing by the sub band combiner 32. A swing buffer error store 140 is also provided and operates in a read modified write mode whereby when a corresponding portion of the swing buffer deshuffle store 132 is written to then a flag is set in the swing buffer error store indicating that data not to be in error whereas each time the data is read that error flag is reset to a state indicating the data to be in error. The data read out of the swing buffer deshuffle store 132 under control of the read address forms the data output that is supplied to the sub band combiner 32.

The primary and secondary decoders illustrated in FIGS. 12 and 13 operate upon the luminance data. A corresponding parallel arrangement operates upon the chrominance data. The fixed length index value data from each of the primary Huffman decoders 70 is switched to a corresponding chrominance swing buffer at the point corresponding to the Y/C pointer 44 in the block headed 36. The secondary decoder of FIGS. 12 and 13 is duplicated for the chrominance channel.

Figure 14:
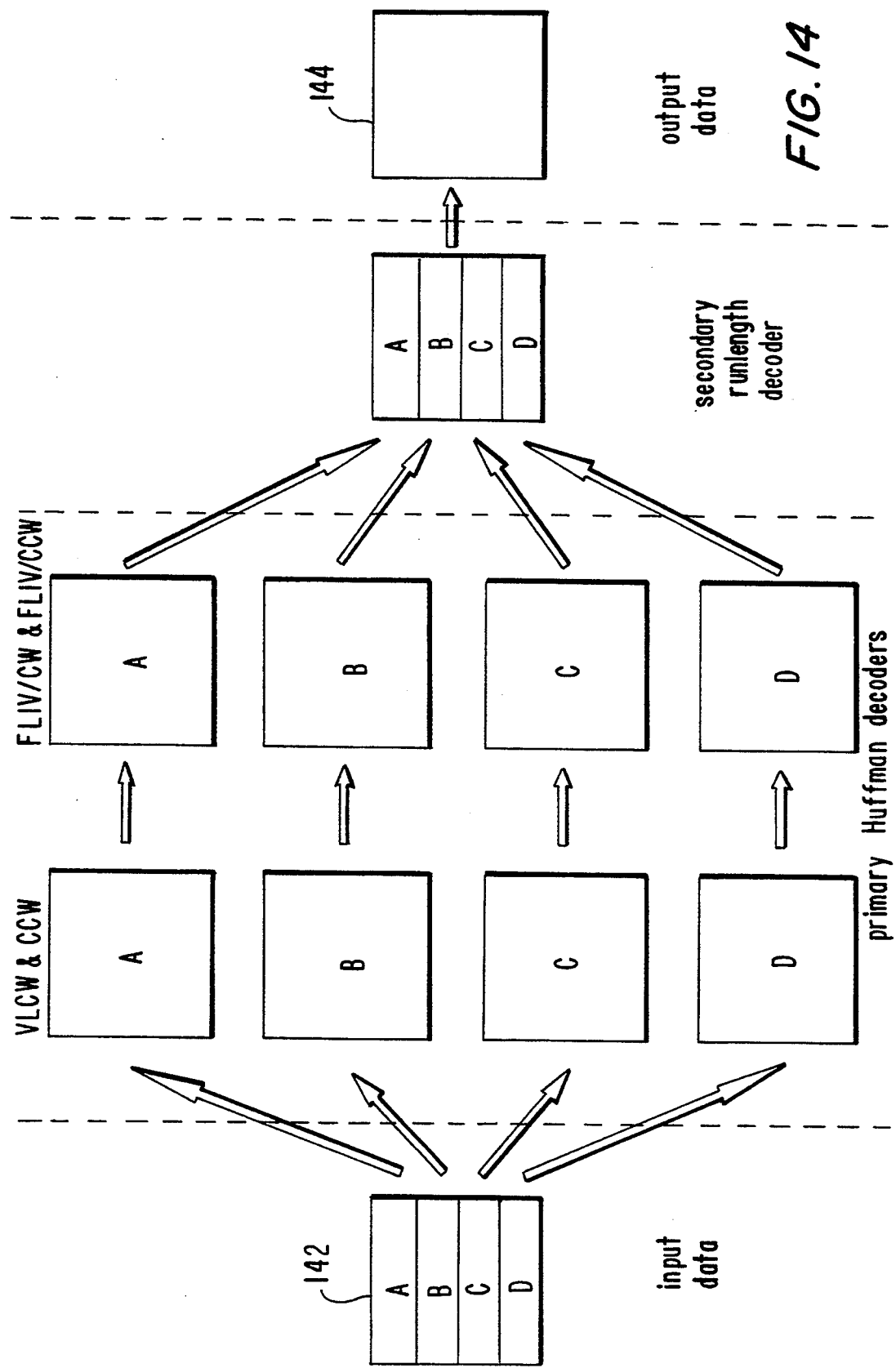
FIG. 14 schematically illustrates the decoding operations of the primary and secondary decoders.

FIG. 14 schematically illustrates the operation of the primary Huffman decoders and the secondary run length decoder. A field of input data 142 comprises four channels each being a spatially sub sampled version of the full field. Each of these channels A, B, C, D is fed to its corresponding primary Huffman decoder 70 where it is mapped from a stream of VLCWs and CCWs to VLIV/CWs and VLIV/CCWs. The fixed length index values are then fed in sequence to the secondary run length decoder where the combined action of the run size state machine 128 and the multiplexer 126 map these fixed length index values into start, end and length values and then to appropriate patterns or runs so as to form the final field of decoded output data 144.

Although illustrative embodiments or the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Apparatus for decoding blocks of serial data each containing variable length code words and control code words, said apparatus comprising:
   (i) a primary decoder for decoding said blocks of serial data into blocks of fixed length index values representing said variable length code words and said control code words; and
   (ii) a secondary decoder operating under control of the fixed length index values representing control code words of a block for decoding each of said fixed length index values representing the respective variable length code words of said block into a variable length sequence of output data values;
   wherein at least some of said control code words of the respective block identify a position within an array of data represented by said variable length code words of said block.

2. Apparatus for decoding blocks of serial data each containing variable length code words and control code words, said apparatus comprising:
   (i) a primary decoder for decoding said blocks of serial data into blocks of fixed length index values representing said variable length code words and said control code words;
   (ii) a secondary decoder operating under control of the fixed length index values representing control code words of a block for decoding each of said fixed length index values representing the respective variable length code words of said block into a variable length sequence of output data values; and
   (iii) a dequantizer for dequantizing said output data values according to a variable dequantization factor.

3. Apparatus as claimed in claim 2, wherein at least some said control code words of a block identify what dequantization factor is used for said block.

4. Apparatus as claimed in claim 2, wherein said secondary decoder comprises a marker detector responsive to a fixed length index value representing a control code word that is a marker code to trigger said index decoder to use a different selectable one of a plurality of secondary decoding tables and said marker detector triggers said dequantizer to use a different dequantization factor.

5. Apparatus for decoding blocks of serial data each containing variable length code works and control code words, said apparatus comprising:
   (i) a primary decoder for decoding said blocks of serial data into blocks of fixed length index values representing said variable length code words and said control code words, said primary decoder uses a selectable one of a plurality of primary decoding tables and at least some of said control code words of a block identify what decoding table is used for said block; and
   (ii) a secondary decoder operating under control of the fixed length index values representing control code words of the respective block for decoding each of said fixed length index values representing the respective variable length code words of said block into a variable length sequence of output data values.

6. Apparatus for decoding blocks of serial data each containing variable length code words and control code words, said apparatus comprising:
   (i) a primary decoder for decoding said blocks of serial data into blocks of fixed length index values representing said variable length code words and said control code words; and
   (ii) a secondary decoder operating under control of the fixed length index values representing control code words of a block for decoding each of said fixed length index values representing the respective variable length code words of said block into a variable length sequence of output data values, said secondary decoder having an index decoder that maps fixed length index values representing variable length code words to respective runlength codes each including a start value, a length value of a run of said start values and an end value terminating said run of said start values.

7. Apparatus as claimed in claim 6, wherein said secondary decoder comprises a runlength state machine responsive to said start value, said length value and said end value to control a multiplex to select for output said start value for a run equal in length to said length value and then select for output said end value.

8. Apparatus as claimed in claim 6, wherein said secondary decoder comprises a marker detector responsive to a fixed length index value representing a control code word that is a marker code to trigger said index decoder to use a different selectable one of a plurality of secondary decoding tables.

9. Apparatus as claimed in claim 7, wherein said secondary decoder comprises a marker detector responsive to a fixed length index value representing a control code word that is a marker code to trigger said index decoder to use a different selectable one of a plurality of secondary decoding tables and said index decoder and said marker detector are configured as parallel pipeline delays for holding fixed length index values from said primary decoder and said marker detector operates to inhibit operation of said runlength state machine during decoding of a marker code.

10. Apparatus as claimed in claim 9, wherein said secondary decoder comprises an flag store configured as a parallel pipeline with said index decoder and said marker detector.

11. Apparatus as claimed in claim 10, wherein said runlength state machine is inhibited by said header flag indicating said index value header or said validity flag indicating invalid data.

12. Apparatus as claimed in claim 10, wherein pipelined data within said index decoder, said marker detector and said flag store are advanced with a common gated clock.

13. Apparatus for decoding blocks of serial data each containing variable length code words and control code words, said apparatus comprising:
   (i) a primary decoder for decoding said blocks of serial data into blocks of fixed length index values representing said variable length code words and said control code words; and
   (ii) a secondary decoder operating under control of the fixed length index values representing control code words of a block for decoding each of said fixed length index values representing the respective variable length code words of said block into a variable length sequence of output data values;
   wherein said blocks of serial data include a serial data header of control code words and said blocks of fixed length index values include an index value header of fixed length index values representing said control code words.

14. Apparatus as claimed in claim 13, wherein said primary decoder outputs a header flag with each fixed length index value indicating whether that fixed length index value is part of said index value header.

15. Apparatus for decoding blocks of serial data each containing variable length code woods and control code words, said apparatus comprising:
   (i) a primary decoder for decoding said blocks of serial data into blocks of fixed length index values representing said variable length code words and said control code words, said primary decoder outputs a validity flag indicating that a fixed length index value at an output of said primary decoder is valid data; and
   (ii) a secondary decoder operating under control of the fixed length index values representing control code words of a block for decoding each of said fixed length index values representing the respective variable length code words of said block into a variable length sequence of output data values.

16. Apparatus for decoding blocks of serial data each containing variable length code words and control code words, said apparatus comprising:
   (i) a plurality of parallel connected primary decoders operating in a timed sequence to decode different portions of a stream of input data formed of said blocks of serial data into at least portions of blocks of fixed length index values representing said variable length code words and said control code words; and
   (ii) a secondary decoder receiving the respective fixed length index value from each of the primary decoders in sequence and operating under control of the fixed length index values representing control code words of a block for decoding each of said fixed length index values representing the respective variable length code words of said block into a variable length sequence of output data values.

17. Apparatus as claimed in claim 16, comprising a swing buffer between each of said primary decoders and said secondary decoder.

* * * * *